United States Patent [19]

Hu et al.

[11] Patent Number: 5,767,567

[45] Date of Patent: Jun. 16, 1998

[54] DESIGN OF DEVICE LAYOUT FOR INTEGRATION WITH POWER MOSFET PACKAGING TO ACHIEVE BETTER LEAD WIRE CONNECTIONS AND LOWER ON RESISTANCE

[75] Inventors: Yung-Chang Hu; Tsuo-Hsin Ma, both of Taipei, Taiwan

[73] Assignee: MageMos Corporation, Taipei, Taiwan

[21] Appl. No.: 707,929

[22] Filed: Sep. 10, 1996

[51] Int. Cl.[6] .................................................. H01L 23/495
[52] U.S. Cl. .................................. 257/666; 257/401
[58] Field of Search .................................. 257/401, 412, 257/330, 331, 153, 249, 666; 438/618, 617, 123

[56] References Cited

U.S. PATENT DOCUMENTS

| | | |
|---|---|---|
| 5,306,937 | 4/1994 | Nishimura . |
| 5,497,013 | 3/1996 | Temple . |
| 5,544,038 | 8/1996 | Fisher et al. . |
| 5,661,315 | 8/1997 | Bauer et al. . |

*Primary Examiner*—Mahshid D. Saadat
*Assistant Examiner*—S. V. Clark
*Attorney, Agent, or Firm*—Bo-In Lin

[57] ABSTRACT

The present invention discloses a MOSFET power IC device formed in a semiconductor chip including a source contact area which is provided for connecting to a lead-frame via a several of lead-wires. The power IC device includes many lead-wire contact points on the source contact area for securely attaching the lead wires onto the source contact area. These lead-wire contact points are uniformly distributed substantially over the source contact area thus the spread resistance is reduced whereby the device on-resistance and device performance may be improved.

8 Claims, 7 Drawing Sheets

DESIGN OF DEVICE LAYOUT FOR INTEGRATION WITH POWER MOSFET PACKAGING TO ACHIEVE BETTER LEAD WIRE CONNECTIONS AND LOWER ON RESISTANCE

BACKGROUND OF THE INVENTION

1. Field of the Invention

This invention relates generally to the device layout and packaging process of power MOSFETs. More particularly, this invention relates to a novel and improved device layout and packaging process for fabricating a power MOSFET device to achieve lower drain to source resistance by lowering the spreading resistance.

2. Description of the Prior Art

Conventional device layout and packaging configuration for fabricating a power metal oxide silicon field effect transistor (MOSFET) power device are limited by the technical difficulty that the on-resistance is increased due to the contact point arrangements of lead wires to the source contact. Specifically, conventional device layout and the lead-wire connection configuration of power MOSFETs, by the of use of either gold wires or aluminum wires, result in higher spread resistance which leads to higher on-resistance.

The difficulty arises from the facts that the device layout of the power MOSFET is designed and manufactured before the transistor is packaged. However, in the process of packaging the transistor, additional lead wires are formed onto the transistor for making connection of the transistor with the pins on the package serving as means for providing external interface. In forming the lead wires onto the transistor contacts, the performance characteristics, e.g., the on-resistance, are impacted. Since the power MOSFET and the package are designed in two separate stages, the impacts on performance characteristics of the power MOSFET due to packaging processes are not taken into consideration in the design stage for the power MOSFET.

FIG. 1A shows a typical power MOSFET package 10 which includes a MOSFET device 15, i.e., the chip, connected to lead frames 20 by the use of lead wires 25, e.g., gold wires with a diameter of approximately 2 mils. The MOSFET device 15 includes a plurality of gate-metal stripes, i.e., the gate runners 30. The gate runners 30 divide the source contact surface into several equally divided areas, e.g., 35-1, 35-2, 35-3, 35-4, and 35-5. The lead wires 25 are then formed to connect the lead frames 20 to the surface of source contact, e.g., 35-1 to 35-5. For the convenience of fabrication and cost savings, the wires 25 are formed to disposed on the source contact surface near the lead frames 20 such that the wires are shorter and easier to maneuver in the wiring processes. However, since the wires 25 are not evenly distributed in the source contact surface, for a point, e.g., point 45, which is located in an area far away from the lead frame 20, there is a spread distance, Ls, between the wire-to-source contact point 40. A drain to source current initiated from the source underneath point 45 has to travel a longer spread distance Ls to reach the lead-to-source contact point 40. The longer the distance Ls, the greater the spread resistance Rs which is generally proportional to the length of the current path. The facts that the source contact surface 35-1 to 35-5 is equally divided by the gate runners 30 and that the lead-wires 25 are randomly formed on one end of the contact surface 35, cause a higher spread resistance thus unduly increasing the on-resistance of the MOSFET device 15 under this device layout and packaging configuration.

FIG. 1B shows another conventional packaging configuration for a power MOSFET device 50 which employs a plurality of aluminum wires 60, which are typically wires of 15 mils in diameter, for connecting to the lead frames 70. Again, the gate runners 75 divide the source contact surface into equal areas 80-1 to 80-4. Due to the facts that wedge bonding process has to applied to bond the aluminum wires 60 to the source contact surface 80-1 to 80-4 and that the angle of the wire from the wedge bonding pad should be less than 60 degrees, the gate runners 75 are arranged to have middle openings to allow the aluminum wires 60 to turn an angle for making connection to the lead frame 70. However, in this configuration, again, the on resistance for the MOSFET device 50 is increased due to the fact that the contact points between the aluminum wires 60 and the source contact surface 80-1 to 80-4 are unevenly distributed. These contact points are long distance away from some source contact points which leads to high spread resistance and in turn causing the on-resistance to increase.

Therefore, there is still a need in the art of power device fabrication, particularly for power MOSFET design and fabrication, to provide a improved design for device layout for integration with the MOSFET packages such that these limitations and difficulties can be resolved.

SUMMARY OF THE PRESENT INVENTION

It is therefore an object of the present invention to provide an improved design for device layout of the power MOSFET to overcome the aforementioned difficulties encountered in the prior art.

Specifically, it is an object of the present invention to provide an improved MOSFET device layout and packaging configuration wherein novel gate runner and source contact topology are arranged to evenly distribute the wire lead contacts thus lowering the spread resistance and the on-resistance.

Another object of the present invention is to provide an improved MOSFET device layout and packaging configuration where the source contact areas divided by the gate runners are flexibly arranged to be proportional to the number of the lead contacts formed in each divided area such that the lead wire contacts are more evenly distributed on the surface of the source contact.

Another object of the present invention is to provide an improved MOSFET device layout and packaging configuration wherein the layout of the gate runners and the source contact areas are flexibly arranged for integrating with the lead wire and lead frame configuration such that the lead wires for source contact connections can be optimally formed to reduce the spread resistance.

Another object of the present invention is to provide an improved MOSFET device layout and packaging configuration wherein the layout of the gate runners and the source contact areas are flexibly arranged which are more suitable for wedge bonding when the aluminum lead wires are employed to simplify the fabrication process and to lower the on resistance.

Briefly, in a preferred embodiment, the present invention includes a MOSFET power integrated circuit (IC) device disposed in a semiconductor chip including a source contact area which is provided for connecting to a lead-frame via a plurality of lead-wires. The power IC device includes a plurality of lead-wire contact points disposed on the source contact area for securely attaching the lead wires thereon wherein the lead-wire contact points are disposed substantially in a uniform distribution over the source contact area.

In an alternate preferred embodiment, this invention discloses a power integrated circuit (IC) device disposed in a semiconductor chip including a source contact area provided with a plurality of lead-wire contact points thereon for connecting to a lead-frame via a plurality of lead-wires to be securely attached to the source contact area on each of the lead-wire contact points. The IC device includes a plurality of gate runners disposed on the source contact area thus dividing the source contact area into several sub-contact areas wherein the several sub-contact areas are arranged with different sizes for substantially distributing the lead-wire contact points uniformly over the source contact area.

In yet another preferred embodiment, this invention discloses an integrated circuit (IC) power device disposed in a semiconductor chip including a source contact area provided with a plurality of lead-wire contact points thereon for connecting to a lead-frame via a plurality of lead-wires to be securely attached to the source contact area on each of the lead-wire contact points. The power IC device includes a plurality of gate runners disposed on the source contact area thus dividing the source contact area into several sub-contact with slant angles for alignment with the lead-wires for connecting to the lead-frames.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
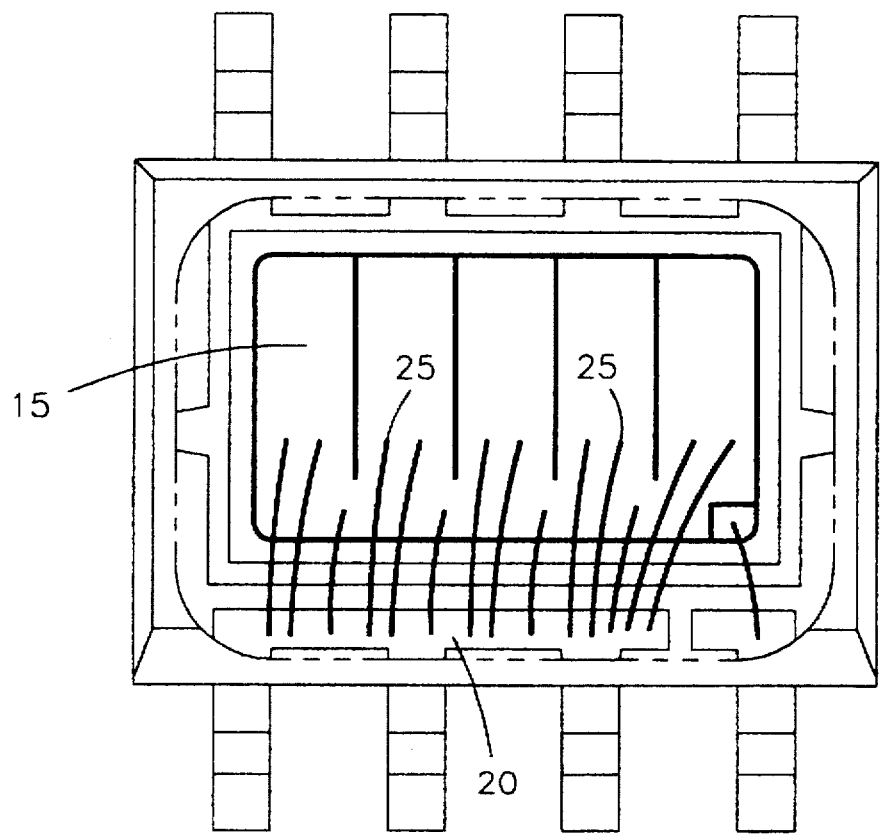
FIGS. 1A and 1B are top views showing conventional device layout and packaging configurations for power MOSFET employing gold wires and aluminum wires respectively.
Figure 1B:
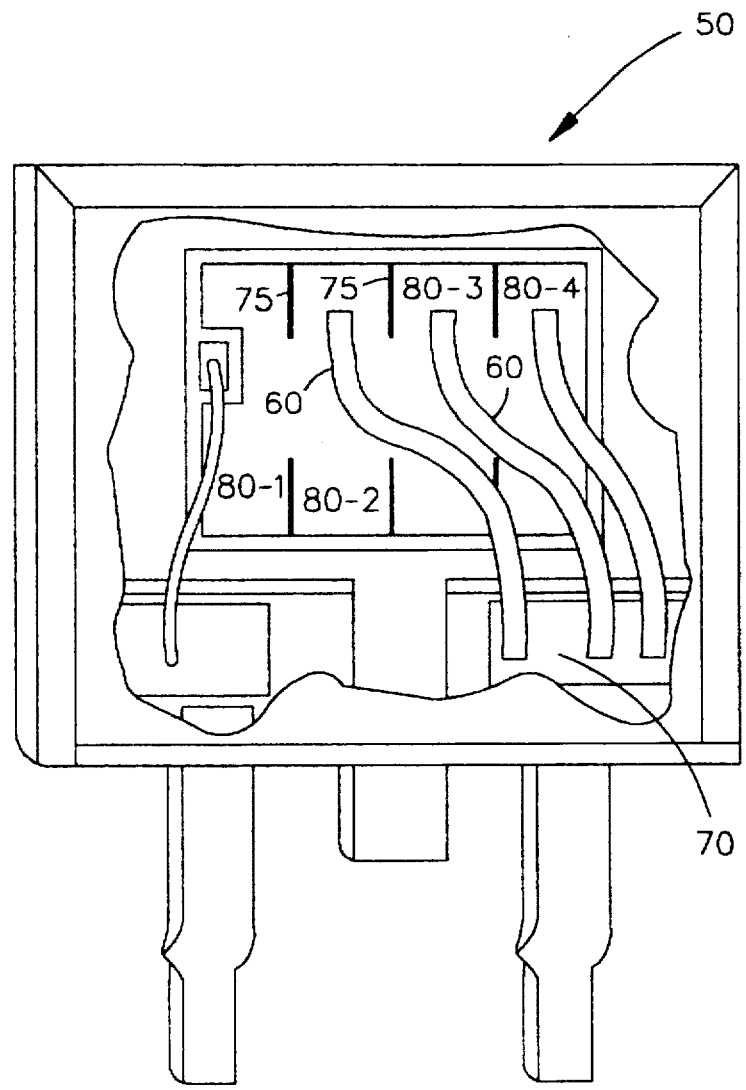
Figure 2A:
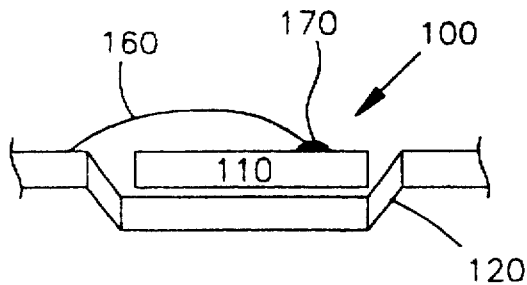
FIGS. 2A to 2D are the cross sectional view and top view respectively of a novel device layout and packaging configuration for a power MOSFET of the present invention.
Figure 2B:
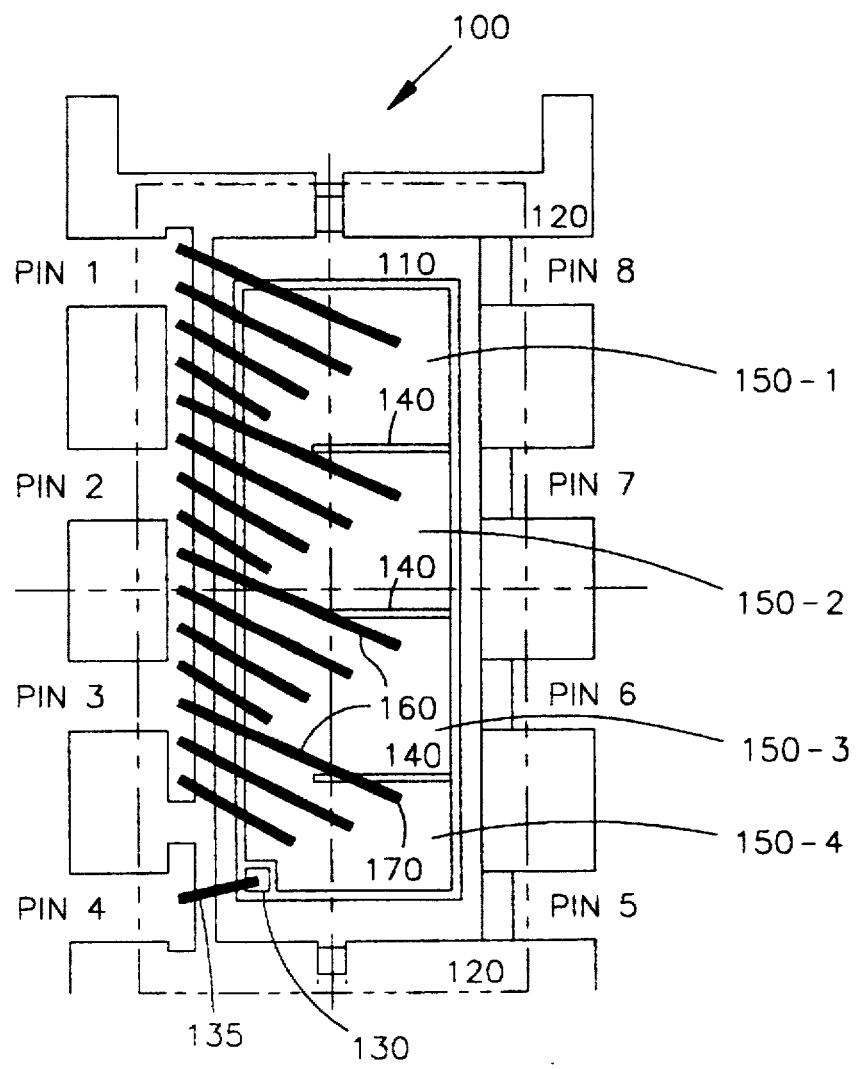

Please refer to FIGS. 2A and 2B for a cross sectional view and top view respectively of a power MOSFET device 100 with novel topology of the gate-runner arrangement. The MOSFET device 100, i.e., the chip, is mounted on a die pad 110 surrounded by lead frames 120. The lead frames 120 are then connected to different pins, e.g., pin 1 to pin 8 as shown, for external interface. The MOSFET device 100 includes a gate contact 130 which is connected to pin 4 with a lead wire 135. The MOSFET device 100 further includes a plurality of gate runners 140 which divide the source contact 150 into several source contact areas, e.g., source contact areas 150-1, 150-2, 150-3, and 150-4. A plurality of lead wires 160 are then formed for connecting the source contact 150 to the lead frames 120. According a principle of this invention, in order to reduce the spread resistance, the topology of the gate runner 140 specially arranged according to the location of the lead frames and the external pins, e.g., pin 1 to pin 4, for dividing the source contact areas 150-1 to 150-4 to source contact areas of unequal sizes. Furthermore, the contact points 170, where the lead wires 160 are connected to the source contact 150, are spread out in each of the contact areas 150-1 to 150-4. The division of the contact areas 150-1 to 150-4 and the spread of the contact points 170 between the lead wire 160 to source contact 150 are arranged to achieve reduced spread resistance. The number of gate runners 140 depends on the device characteristics. For large devices, more gate runners 140 are used to reduce the gate resistance and improve the switching speed. In addition to the number, i.e., $N_{GR}$, of gate runners 140, the ratio of the contact areas for uniformly distributing the wires 160 in several contact area divided by the gate runners 140 also depends on the number, i.e., $N_{LW}$, of the lead wires 140. In general, the number $N_{LW}$ of lead wire wires 140 is determined by: a) the number of wires the device needs, i.e., $N_{NEED}$ and b) the number of wires the lead frame can accommodate, i.e. $N_{FRAME}$.

$$N_{LW} = \text{Minimum}\{N_{NEED}, N_{FRAME}\} \quad (1)$$

A basic number of wires to be distributed in each of the contact areas $N_{BASIC}$ is:

$$N_{BASIC} = \text{Integer of}\{N_{LW}/(N_{GR}+1)\} \quad (2)$$

and $$N_{LW} = (N_{GR}+1)N_{BASIC} + N_{REMAINER} \quad (3)$$

Where $N_{REMAINER}$, i.e., the remainder of equal of distribution, has an integer value ranging between zero and ($N_{BASIC}-1$). In order to more evenly distribute the lead wires 160 into ($N_{GR}+1$) contact areas, a simple basic rule is established to divide the lead wires into ($N_{GR}+1$) groups where:

$$N_{LW} = N(1)+N(2)+\ldots+N(K)+N(K+1)+\ldots+N(GR+1) \quad (4)$$

Where $N(1)=N(2)=N(3)=\ldots=N(K)=N_{BASIC}$, and $N(K+1)=N(K+2)\ldots=N(GR+1)=(N_{BASIC}+1)$ and $K=(N_{GR}+1)-N_{REMAINDER}$. The above basic rule can be easily understood with an example, for instance, the total number of lead wires, i.e., $N_{LW}$, is 19, the number of gate runners $N_{GR}$ is 4, a basic equal distribution is $N_{BASIC}$ is 3 and a remainder of equal distribution $N_{REMAINDER}$ is 4. The lead wires are distributed into five groups with a distribution ratio of {3:4:4:4:4}, i.e., a distribution according to Equation (4), where K=(4+1)−4=1 and ($N_{BASIC}+1$)=4. Based on this ratio, the contact areas 150 are then divided by the gate runners 140 to have substantially the same ratio.

In the preferred embodiment shown in FIGS. 2A and 2B, with three gate runners 140, the source contact area 150 are divided, according to the above basic equal distribution rule, into four sub-contact areas having a proportion of approximately 4:4:4:3 between the contact areas 150-1 to 150-4. The lead wire 160 are then arranged to spread out in each of the contact areas 150-1 to 150-4. A simplified method is applied to spread the lead wire contact points 170 in each of the contact source areas 150-1 to 150-4 by dividing the width, i.e., W, and length, i.e., L, into equal segments of $\Delta X$ and $\Delta Y$, i.e., $\Delta X=W/N$ and $\Delta Y=L/N$, and then placing the contact points 170 on the point ($k\Delta X$, $k\Delta Y$) where k=1 to N and N is the number of wire leads placed into that area, e.g., N=4 for source contact areas 150-1 to 150-3, and N=3 for source contact area 150-3. By spreading the points of contact 170 in each of these areas, for a power MOSFET device 100 of size of W=98 mils and L=160 mils (which have die pad size of approximately 106 mils by 166 mils), the spread resistance is reduced from a range of 12 to 15 milli-ohms to approximately 7 to 10 milli-ohms. The improvement in spread resistance may depend on the device characteristics. For a 30-volts device, about ten to twenty percents (10%–20%) of the total on-resistance are caused by the spread resistance, while the percentage for a lower 12-volts device can be as high as thirty to fifty percents (30–50%) due to the spread resistance. Generally, by applying the design rules disclosed in this invention, greater improvements in performance are achieved for lower voltage device.

Figure 2C:
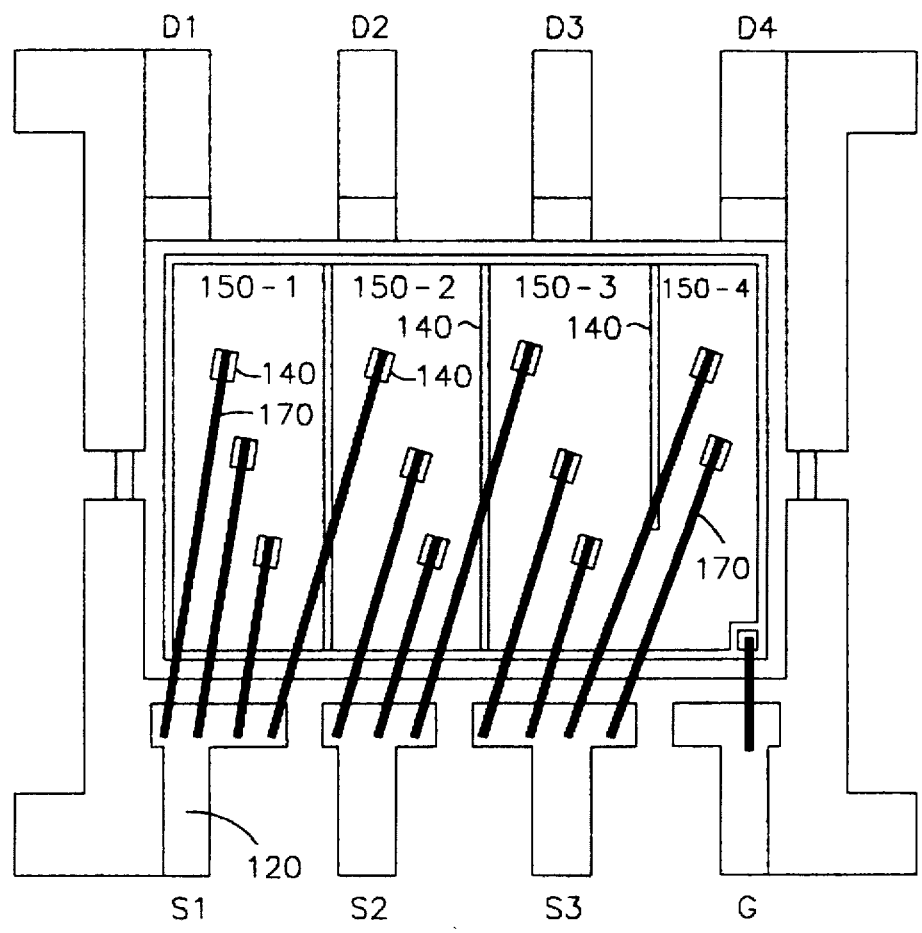
Figure 2D:
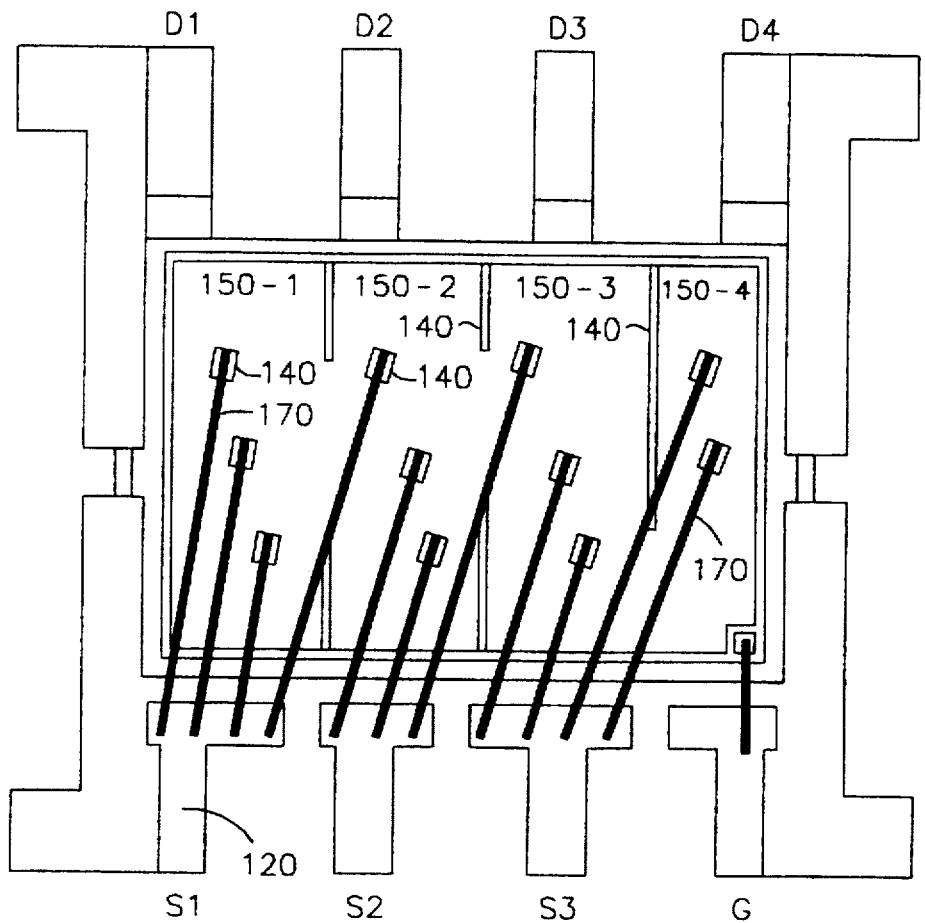

FIGS. 2C and 2D are top views of two alternate embodiments of a power MOSFET device similar to that shown in FIGS. 2A and 2B, except that the gate runners 140 are arranged differently. These types of gate runner arrangements are implemented for die size reduction and speed improvement.

Therefore, in a preferred embodiment, the present invention includes a MOSFET power integrated circuit (IC) device 100 disposed in a semiconductor chip 110 including a source contact area 150 which is provided for connecting to a lead-frame 120 via a plurality of lead-wires 160. The power IC device includes a plurality of lead-wire contact points 170 disposed on the source contact area 150 for securely attaching the lead wires 160 thereon wherein the lead-wire contact points 170 are disposed substantially in a uniform distribution over the source contact area 150.

In an alternate preferred embodiment, this invention discloses a power integrated circuit (IC) device 100 disposed in a semiconductor chip 110 including a source contact area 150 provided with a plurality of lead-wire contact points 170 thereon for connecting to a lead-frame 120 via a plurality of lead-wires 160 to be securely attached to the source contact area 150 on each of the lead-wire contact points 160. The IC device includes a plurality of gate runners 140 disposed on the source contact area 150 thus dividing the source contact area into several sub-contact areas 150-1, 150-2, 150-3, and 150-4 wherein the several sub-contact areas 150-1 to 150-4 are arranged with different sizes for substantially distributing the lead-wire contact points 170 uniformly over the source contact area 150.

This invention also discloses a method to configure a source contact area 150 on a power MOSFET device 100 by dividing said source contact areas 150 with several gate runners 140 disposed thereon, the method including steps of: (a) determining a total number of lead wires 160 for connecting to a lead frame 120 from the source contact area 150 on the MOSFET power device 100; and (b) configuring the gate runners 140 for dividing the source contact area 150 into several sub-contact areas 150-1 to 150-4 with a set of area proportional ratios, e.g., 4:4:4:3, for disposing several of the lead wires 160 in each of the sub-contact areas 150-1 to 150-4 according to the set of area proportional ratios, e.g., 4:4:4:3.

Figure 3:
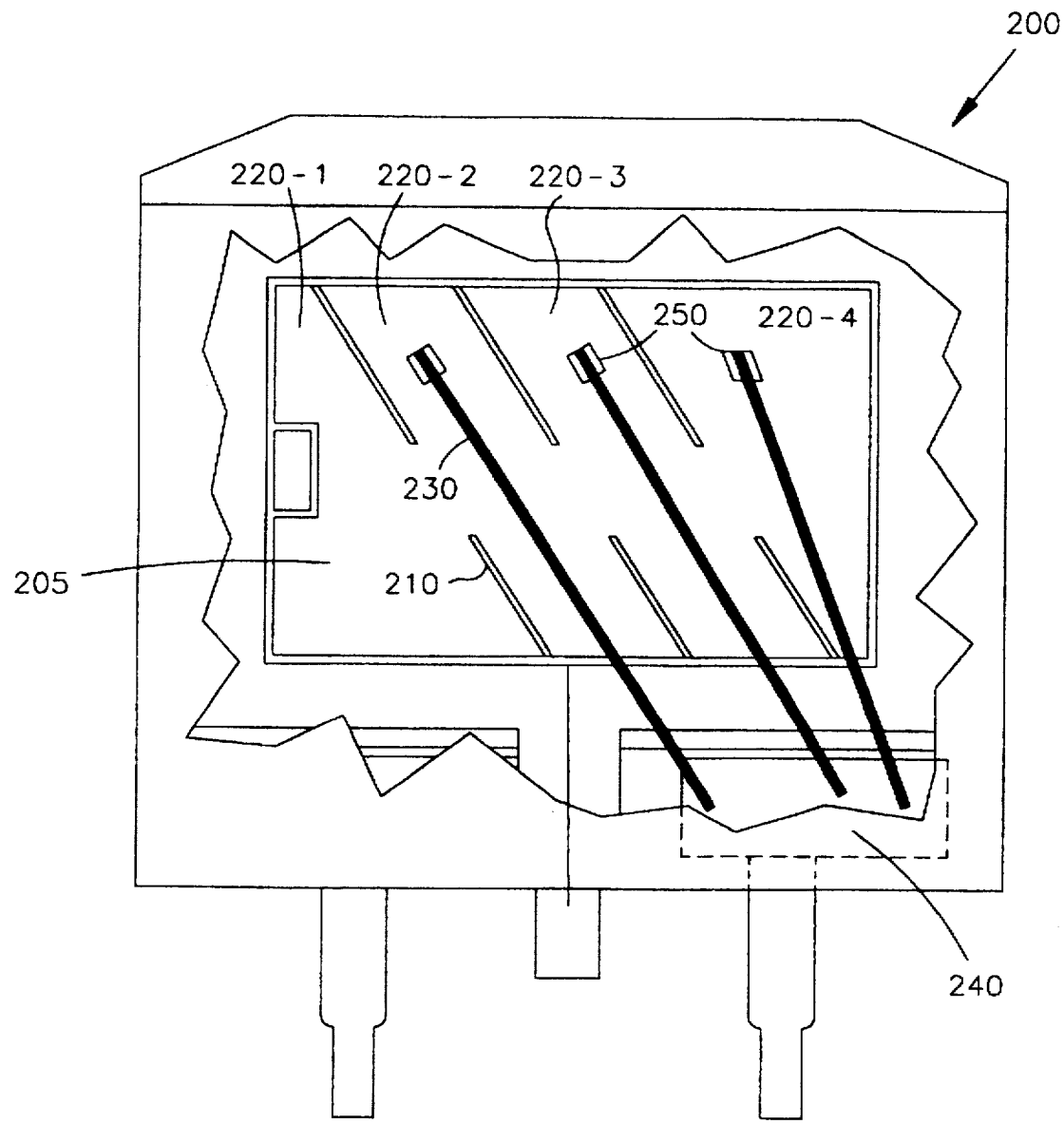
FIG. 3 is a top view showing a novel device layout with the gate runners slanted toward the lead frames thus dividing the source contact area into slanted sub-regions and more suitable to form wedge bond in the sub-region for the aluminum wires.

Please refer to FIG. 3 for a top view showing a novel device layout and packaging configuration for a power MOSFET 200 of the present invention. The power MOSFET device 200 includes a plurality of gate runners 210 which divide the source contact area into a plurality of sub-regions, e.g., sub-regions 220-1, 220-2, 220-3, and 220-4. In each sub-region, there is a aluminum wire 230 connecting the source contact area 220-2 to 220-4 to a lead frame 240 surrounding the MOSFET chip 205. The device layout is modified to align with a angular slant toward the lead frame 240 such that it is easily integratable with lead frame 240. Specifically, the aluminum wire 230 in this layout can be formed in each of these contact sub-regions 220-1 to 220-4 with a wedge bonding directed to the lead frame 240. The aluminum wire 210 can therefore be formed by employing a wedge bonding 250 without an angular turn as that required in the prior art. More reliable packaging is achieved because the straight wire arrangement.

Thus, this invention discloses an integrated circuit (IC) power device 200 disposed in a semiconductor chip 205 including a source contact area 220 provided with a plurality of lead-wire contact points 250 thereon for connecting to a lead-frame 240 via a plurality of lead-wires 230 to be securely attached to the source contact area 220 on each of the lead-wire contact points 250. The power IC device 200 includes a plurality of gate runners 210 disposed on the source contact area 220 thus dividing the source contact area into several sub-contact areas 220-1, 220-2, 220-3, and 220-4 with slant angles for alignment with the lead-wires 230 for connecting to the lead-frames 240.

Figure 4:
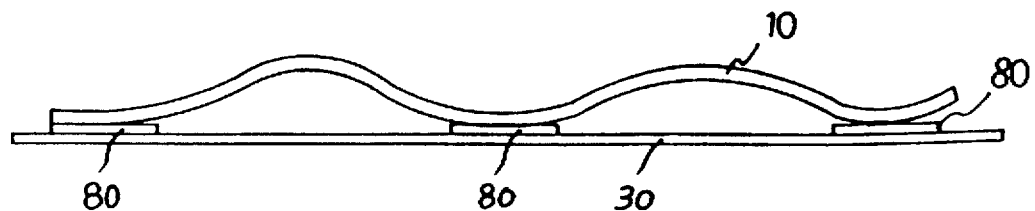
FIG. 4 is a cross sectional view of the aluminum wire with stitch contacts distributed over the source contact areas to evenly distribute the contact points thus reducing the spread resistance.

Please refer to FIG. 4 for additional improvement to reduce the MOSFET spread resistance of the aluminum wire connection. Instead of a single aluminum wire contact point to the source contact surface 220-4 to 220-4, the aluminum wire are formed to have "stitch contacts" 250 with the source contact areas 220-2 to 220-4. The purpose of the stitch contacts is to generate more points of wire-source contact such that the contact points 250 are more evenly distributed in each of the source contact sub-regions 220-1 to 220-4. The spread resistance is therefore reduced with more numerous and more evenly distributed contacts in each sub-regions.

The basic design rule is to evenly distribute the wires 230 and the contact points 250 over the contact areas 220-1 to 220-4 which are divided by the gate runners 210. Typically, for a device package which employs aluminum wires 230, only one to two wires are distributed in each slanted contact area, e.g., 220-2 to 220-4. The distance between stitch contact points 250 can be flexibly arranged depending on the machine capability and the production costs involved in making these stitch contacts. The stitch contact points can be formed for each aluminum wire 230 to have distance of several mils or with even smaller distance. A measurable improvements of five to almost twenty percents (5–20%) of the spread resistance, and thus correspondingly the on-resistance, are achievable because of the more uniform distribution of the contact points over the source contact areas.

Figure 5:
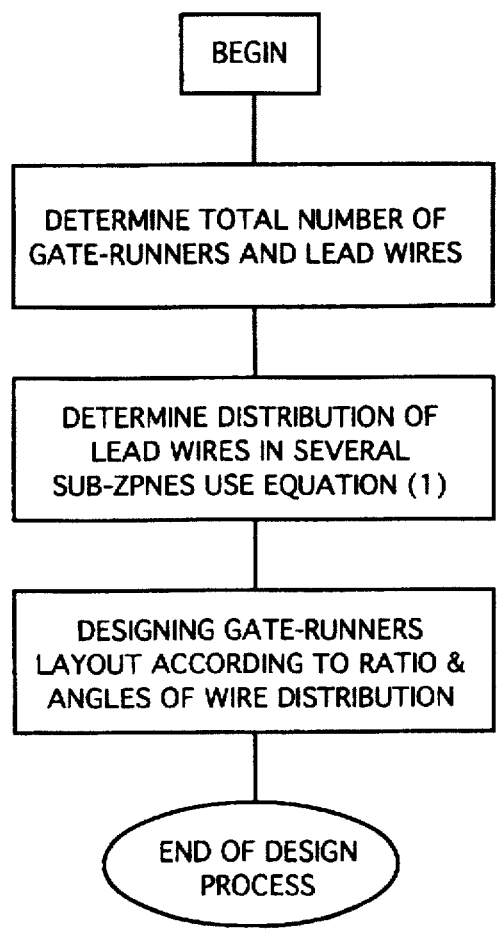
FIGS. 5 is a flow chart showing the design process for design the device layout with different gate runner arrangements to achieve optimal packaging and device performance characteristics.

Referring to FIG. 5 for a flow chart for design the layout configuration of a source contact area 150. To start the design process (step 300), the total number $N_{GR}$ of gate runners 140 and the lead wires 160, i.e., $N_{LW}$, for connecting to a lead frame 120 are first determined (step 310). The ratios of lead wires 160 to be distributed in $N_{GR}+1$ sub-contact regions, e.g., 150-1 to 150-4, are then computed according to Equations (1) to (4), (step 320). The layout of the gate runners 140 are then designed (step 330) according to the ratios determined in step 320. Similarly, for designing a layout of the source contact area when the aluminum wires are employed, the slant angles of the lead wires are first determined based on the relative location of the chip and lead frame. Then the layout of the gate runners are determined to comply with the slant angles required for the wedge bonding pads used for attaching the aluminum lead wires such that the lead wire twist may be minimized.

Therefore, the present invention provides an improved design for device layout and packaging configuration for manufacturing the power MOSFET to overcome the difficulties encountered in the prior art. Specifically, an improved MOSFET device layout and packaging configuration are provided wherein novel gate runner and source contact topology are arranged to evenly distribute the lead wire contacts on the source contact surface thus lowering the spread resistance and the on-resistance. The source contact areas divided by the gate runners are now flexibly arranged to be proportional to the number of the lead contacts formed in each divided area such that the lead wire contacts are more evenly distributed on the surface of the source contact. The gate runners and the source contact areas are flexibly arranged for integrating with the lead wire and lead frame configuration such that the lead wires for source contact connections can be optimally formed with the packaging configuration to reduce the spread resistance. In a MOSFET device package where aluminum wires are employed, the gate runners and the source contact areas are flexibly arranged with an angular slant toward the lead frame which are more suitable for wedge bonding. Furthermore, stitch contacts are formed to more evenly distributed the contact points on the source contact surface such that the spread resistance can be reduced.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A power integrated circuit (IC) device disposed in a semiconductor chip including a source contact area provided with a plurality of lead-wire contact points thereon for connecting to a lead-frame via a plurality of lead-wires to be securely attached to said source contact area on each of said lead-wire contact points, said IC device comprising:

a plurality of gate runners disposed on said source contact area thus dividing said source contact area into several sub-contact areas wherein said several sub-contact areas are arranged with different sizes for substantially distributing said lead-wire contact points uniformly over said source contact area.

2. A power integrated circuit (IC) device disposed in a semiconductor chip including a source contact area provided with a plurality of lead-wire contact points thereon for connecting to a lead-frame via a plurality of lead-wires to be securely attached to said source contact area on each of said lead-wire contact points, said IC device comprising:

a plurality of gate runners disposed on said source contact area thus dividing said source contact area into several sub-contact areas with slant angles for alignment with said lead-wires for connecting to said lead-frames.

3. The integrated circuit (IC) power device of claim 2 wherein:

each of said lead wires for connecting to said lead frames includes several stitch contact points attaching to a top surface of said source contact area thus increasing said lead wire contact points disposed on said source contact area.

4. The integrated circuit (IC) power device of claim 2 wherein:

each of said lead wires is an aluminum wire and each of said lead wire contact points includes a wedge bonding pad for securely attaching said aluminum wires to said top surface of said source contact area.

5. A MOSFET power device disposed in a semiconductor chip including a source contact area provided with a plurality of lead-wire contact points thereon for connecting to a lead-frame via a plurality of lead-wires to be securely attached to said source contact area on each of said lead-wire contact points, said IC device comprising:

a plurality of gate runners disposed on said source contact area thus dividing said source contact area into several sub-contact areas wherein said several sub-contact areas are arranged with different sizes for substantially distributing said lead-wire contact points uniformly over said source contact area.

6. The MOSFET power device of claim 5 wherein:

said plurality of gate runners disposed on said source contact area dividing said source contact area into several sub-contact areas of substantially equal size for disposing an evenly-distributed equal number of said lead wire contact points therein with a remainder number of sub-contact areas having smaller areas for disposing a less lead wire contact points therein wherein said less wire contact points being one less than said evenly distributed equal number of said wire contact points.

7. A method to configure a source contact area on a power MOSFET device by dividing said source contact areas with several gate runners disposed thereon, said method including steps of:

(a) determining a total number of lead wires for connecting to a lead frame from said source contact area on said MOSFET power device; and (b) configuring said gate runners for dividing said source contact area into several sub-contact areas with a set of area proportional ratios for disposing several of said lead wires in each of said sub-contact areas according to said set of area proportional ratios.

8. A method to configure a source contact area on a power MOSFET device by dividing said source contact areas with several gate runners disposed thereon, said method including steps of:

(a) determining a total number of lead wires and angles of bonding pads for connecting to a lead frame from said source contact area on said MOSFET power device; and (b) configuring said gate runners according said total number of lead wires and said angles of bonding pads for designing a layout of said gate runners in said source contact area.

* * * * *